US010340477B2

(12) United States Patent
Kwon et al.

(10) Patent No.: US 10,340,477 B2
(45) Date of Patent: Jul. 2, 2019

(54) DISPLAY DEVICE AND METHOD OF MANUFACTURING DISPLAY DEVICE

(71) Applicant: Samsung Display Co., Ltd., Yongin-si, Gyeonggi-do (KR)

(72) Inventors: Hyojeong Kwon, Yongin-si (KR); Ohjune Kwon, Yongin-si (KR); Seungyong Song, Yongin-si (KR); Seungwook Kwon, Yongin-si (KR); Doohwan Kim, Yongin-si (KR); Minsang Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/869,264

(22) Filed: Jan. 12, 2018

(65) Prior Publication Data
US 2019/0074478 A1    Mar. 7, 2019

(30) Foreign Application Priority Data

Sep. 6, 2017    (KR) .................. 10-2017-0114041

(51) Int. Cl.
*H01L 51/52*    (2006.01)
*H01L 51/00*    (2006.01)
(Continued)

(52) U.S. Cl.
CPC ...... *H01L 51/5253* (2013.01); *H01L 27/3276* (2013.01); *H01L 51/0097* (2013.01); *H01L 51/56* (2013.01); *H01L 2251/5338* (2013.01)

(58) Field of Classification Search
CPC . H01L 51/5253; H01L 27/3276; H01L 51/56; H01L 51/0097; H01L 27/3272; H01L 51/529; H01L 2251/5338; H01L 27/3244; H01L 51/5281; H01L 2227/323; H01L 27/323; H01L 2251/566;
(Continued)

(56) References Cited

U.S. PATENT DOCUMENTS 9,048,443 B2    6/2015    Namkung et al.
9,748,315 B2    8/2017    Kim
(Continued)

FOREIGN PATENT DOCUMENTS

KR    1020140085956 A    7/2014
KR    1020150007632 A    1/2015
(Continued)

*Primary Examiner* — Thanh T Nguyen
(74) *Attorney, Agent, or Firm* — Cantor Colburn LLP

(57) ABSTRACT

A method of manufacturing a display device includes: providing a substrate including a first area, a second area at an end portion of the substrate, and a bendable area between the first and second areas; forming a display element on a first surface of the substrate in the first area; attaching a protective film on a second surface of the substrate which is opposite to the first surface thereof, in the first, second and bendable areas; attaching an electronic element on the first surface in the second area; forming a bending protective layer on the first surface in the bendable area, the bending protective layer extending from the bendable area to cover the electronic element in the second area of the substrate; and in the bendable area of the substrate, removing a portion of the protective film on the second surface of the substrate.

9 Claims, 8 Drawing Sheets

(51) Int. Cl.
*H01L 51/56* (2006.01)
*H01L 27/32* (2006.01)
(58) Field of Classification Search
CPC ............. H01L 51/5212; H01L 51/5228; H01L 27/124; H01L 27/3262; Y02P 70/521; Y02E 10/549
See application file for complete search history.

(56) References Cited

U.S. PATENT DOCUMENTS

| | | | |
|---|---|---|---|
| 2014/0042406 A1* | 2/2014 | Degner | H01L 27/326 257/40 |
| 2016/0204366 A1 | 7/2016 | Zhang et al. | |
| 2016/0285046 A1* | 9/2016 | Son | H01L 27/3276 |
| 2016/0322601 A1* | 11/2016 | Lee | H01L 51/5256 |
| 2017/0062773 A1 | 3/2017 | Lee et al. | |
| 2017/0263887 A1 | 9/2017 | Han et al. | |
| 2018/0092166 A1* | 3/2018 | Kim | H05B 33/04 |

FOREIGN PATENT DOCUMENTS

| | | |
|---|---|---|
| KR | 1020150069308 A | 6/2015 |
| KR | 1020160016267 A | 2/2016 |
| KR | 1020170096089 A | 8/2017 |
| KR | 1020170106590 A | 9/2017 |
| KR | 1020170115213 A | 10/2017 |
| KR | 1020170127392 A | 11/2017 |

* cited by examiner

DISPLAY DEVICE AND METHOD OF MANUFACTURING DISPLAY DEVICE

This application claims priority to Korean Patent Application No. 10-2017-0114041, filed on Sep. 6, 2017, and all the benefits accruing therefrom under 35 U.S.C. § 119, the content of which is incorporated herein in its entirety by reference.

BACKGROUND

1. Field

One or more embodiments relate to a display device and a method of manufacturing the display device. More particularly, one or more embodiments relate to a display device and a method of manufacturing the display device which may reduce a defect occurrence rate during a manufacturing process while saving manufacturing costs.

2. Description of the Related Art

Generally, a display device includes a display unit with which an image is generated and/or displayed, arranged on a substrate. Visibility at various angles may be improved or an area of a non-display area may be reduced by bending at least a portion of the display device.

However, in a display device according to the related art, defects may occur, life of a display device may be reduced, or excessive manufacturing costs are incurred during a process of manufacturing a bent display device.

SUMMARY

One or more embodiments include a method of manufacturing a display device, which may reduce a defect occurrence rate during a manufacturing process while saving manufacturing costs. However, this objective is provided as an example and the scope of the present disclosure is not limited thereto.

According to one or more embodiments, a method of manufacturing a display device includes: providing a substrate of the display device including a first area, a second area at an end portion of the substrate, and a bendable area between the first and second areas; forming a display element on a first surface of the substrate in the first area thereof; attaching a protective film on a second surface of the substrate which is opposite to the first surface thereof, the protective film disposed in the bendable area and at least a portion of the first area and the second area; attaching an electronic element on the first surface in the second area of the substrate; forming a bending protective layer on the first surface in the bendable area of the substrate, the bending protective layer extending from the bendable area of the substrate to cover the electronic element in the second area of the substrate; and in the bendable area of the substrate, removing a portion of the protective film on the second surface of the substrate.

The removing may include contacting a heated heat block to the portion of the protective film in the bendable area of the substrate.

The removing may include reducing a thickness of the protective film in the bendable area of the substrate to be less than a thickness of the protective film in the first area of the substrate.

The bending protective layer extending from the bendable area of the substrate to cover the electronic element in the second area of the substrate may expose a portion of the first surface in the second area of the substrate, and the method may further include attaching a printed circuit board onto the exposed of the first surface of the substrate.

The method may further include bending the substrate at the bendable area thereof to dispose the first surface in the bendable area facing outside the display device and the second surface in the bendable area inside the display device.

According to one or more embodiments, a display device includes: a substrate including a first surface, a second surface opposite to the first surface, a first area, a second area at an end portion of the substrate, and a bent area between the first and second areas, the first surface in the bent area is arranged facing outside the display device and the second surface in the bent area is arranged inside the display device; a display element on the first surface in the first area of the substrate; an electronic element on the first surface in the second area of the substrate; a bending protective layer on the first surface in the bent area of the substrate, the bending protective layer extending from the bent area of the substrate to cover the electronic element in the second area of the substrate; and a protective film on the second surface of the substrate, where a groove is defined in the protective film in the bent area of the substrate.

The protective film in the bent area of the substrate may include a heat-degenerated portion adjacent to the groove, the heat-degenerated portion having a larger thickness than that of remaining portions of the protective film.

The protective film in the bent area of the substrate may include a first portion having a constant thickness and a second portion adjacent to the groove, the second portion being between the first portion and the groove and having a thickness greater than that of the first portion.

The bending protective layer extended from the bent area of the substrate to cover the electronic element in the second area of the substrate may expose a portion of the second area of the substrate, and the display device may further include a printed circuit board attached to the exposed portion of the second area.

The bending protective layer may further extend from the bent area of the substrate to be disposed in the first area of the substrate.

According to one or more embodiment, a method of manufacturing a display device may reduce a defect occurrence rate during a manufacturing process while saving manufacturing costs, and a display device manufactured thereby may be implemented. However, the scope of the present disclosure is not limited by this effect.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
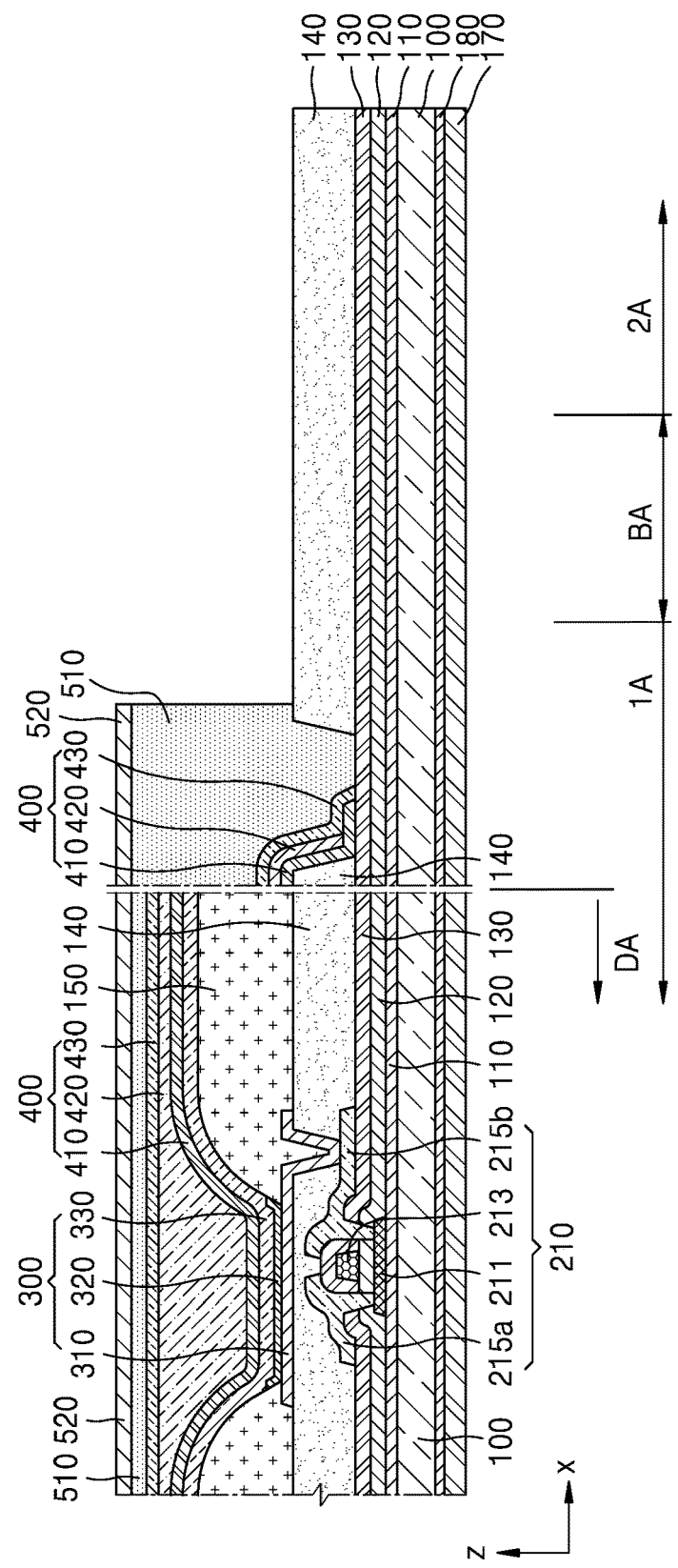
FIGS. 1 to 5 are cross-sectional views of processes of an exemplary embodiment of a method of manufacturing a display device, according to the invention.

As the disclosure allows for various changes and numerous embodiments, exemplary embodiments will be illustrated in the drawings and described in detail in the written description. An effect and a characteristic of the disclosure, and a method of accomplishing these will be apparent when referring to embodiments described with reference to the drawings. This disclosure may, however, be embodied in many different forms and should not be construed as limited to the example embodiments set forth herein.

Hereinafter, the disclosure will be described more fully with reference to the accompanying drawings, in which example embodiments of the disclosure are shown. When description is made with reference to the drawings, like reference numerals in the drawings denote like or corresponding elements, and repeated description thereof will be omitted.

It will be understood that when a component, such as a layer, a film, a region, or a plate, is referred to as being related to another component such as being "on" another component, the component can be directly on the other component or intervening components may be present thereon. In contrast, when a component, such as a layer, a film, a region, or a plate, is referred to as being related to another component such as being "directly on" another component, no component or intervening components are be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIGS. 1 to 5 are cross-sectional views of processes of an exemplary embodiment of a method of manufacturing a display device according to the invention.

The display device displays an image with light. The light for displaying the image may be generated and provided from outside the display device, or may be generated and emitted from within the display device.

A substrate 100 of the display device is prepared. The substrate 100 is disposed in a plane parallel to that defined by two directions (e.g., x direction and y direction) which cross each other. A thickness of the substrate 100 and/or layers thereon is defined in another direction (e.g., z direction) which crosses each of the two directions described above.

The substrate 100 includes a bent area BA extending in a first direction (+y direction). The substrate 100 and layers thereon may be bendable at the bent area BA. A total area of the bent area BA may be an area of the substrate 100 defined by a dimension of the substrate 100 along the x direction, and an entirety of the portion along the y direction. The bent area BA is arranged between a first area 1A and a second area 2A in a second direction (+x direction) crossing the first direction. The second area 2A is disposed at an end portion of the substrate 100, where the first area 1A is disposed at an inner portion of the substrate 100. Though described below, the substrate 100 may be bent around a bending axis BAX (see FIG. 6) extending in the first direction (+y direction), such that a portion of the first area 1A may face at least a portion of the second area 2A along the z direction.

The substrate 100 may include various flexible or bendable materials, e.g., polymer resins such as polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate ("PAR"), polyimide ("PI"), polycarbonate ("PC") or cellulose acetate propionate ("CAP").

Display elements are formed on a first surface of the prepared substrate 100, which is an upper surface (among surfaces arranged in the +z direction) of the substrate 100. In addition to the display elements, various elements and layers such as a thin film transistor ("TFT") 210 may be formed on the first surface of the prepared substrate 100.

The display device includes a display area DA at which the image is displayed, and a non-display (peripheral) area at which the image is not displayed. The display area DA and the non-display area may together define an entirety of a planar dimension of the substrate 100 and/or the display device, without being limited thereto.

As illustrated in FIG. 1, the first area 1A of the substrate 100 includes the display area DA. Therefore, display elements, etc. are formed in the display area DA to generate and display the image. The first area 1A may include not only the display area DA but also a portion of a non-display area which is outside the display area DA. Furthermore, depending on cases, unlike FIG. 1, the display area DA may extend to at least a portion of the bent area BA, and various modifications may be made. The second area 2A includes the non-display area, but the display area DA may extend to at least a portion of the non-display area when needed.

Though FIG. 1 illustrates that an organic light-emitting diode ("OLED") 300 as a display element for generating and emitting light to display an image is formed, the present disclosure is not limited thereto and various display elements such as a liquid crystal device may be formed. In addition to a display element such as the OLED 300, the TFT 210 to which the display element is electrically connected for controlling the display element may be formed in the display area DA. Electric connection of the OLED 300 to the TFT 210 may be understood as electric connection of a pixel electrode 310 to the TFT 210. When needed, a TFT (not shown) may be formed in a peripheral area outside the display area DA of the substrate 100. The TFT arranged in the peripheral area may be a portion of a circuit unit for controlling an electric signal applied into, for example, the display area DA.

The TFT 210 may include a semiconductor layer 211 including amorphous silicon, polycrystalline silicon or an organic semiconductor material, a gate electrode 213, a source electrode 215a and a drain electrode 215b. To secure insulation between the semiconductor layer 211 and the gate electrode 213, a gate insulating layer 120 including an inorganic material such as a silicon oxide, a silicon nitride and/or a silicon oxynitride may be arranged between the semiconductor layer 211 and the gate electrode 213. Also, an interlayer insulating layer 130 including an inorganic material such as a silicon oxide, a silicon nitride, and/or a silicon oxynitride may be arranged on the gate electrode 213. The source electrode 215a and the drain electrode 215b may be arranged on the interlayer insulating layer 130.

The insulating layer including the inorganic material may be formed by chemical vapor deposition ("CVD") or atomic layer deposition ("ALD"). The same is true of embodiments described below and modifications thereof. The gate insulating layer 120 and/or the interlayer insulating layer 130 disposed in the display area DA at the TFT 210, may extend from the display area DA to the non-display area, such as to be disposed in the first area 1A, the bent area BA and/or the second area 2A.

A buffer layer 110 may be arranged between the TFT 210 having the above structure and the substrate 100. The buffer layer 110 may include an inorganic material such as a silicon oxide, a silicon nitride, and/or a silicon oxynitride. The buffer layer 110 may planarize the upper surface of the substrate 100 or effectively prevent or minimize penetration of impurities entering into a layer of the display device from the substrate 100, etc. into the semiconductor layer 211 of the TFT 210. The buffer layer 110 disposed in the display area DA at the TFT 210, may extend from the display area DA to the non-display area, such as to be disposed in the first area 1A, the bent area BA and/or the second area 2A.

A planarization layer 140 may be arranged on the TFT 210. In an exemplary embodiment, for example, in the case where the OLED 300 is arranged over the TFT 210 as illustrated in FIG. 1, the planarization layer 140 may generally planarize an upper portion of a protective layer covering the TFT 210. The planarization layer 140 may include, for example, an organic material such as acryl, benzocyclobutene ("BCB") or hexamethyldisiloxane ("HMDSO"). The planarization layer 140 disposed in the display area DA at the TFT 210, may extend from the display area DA to the non-display area, such as to be disposed in the first area 1A, the bent area BA and/or the second area 2A.

Though FIG. 1 illustrates that the planarization layer 140 is a single layer, the planarization layer 140 may be a multiple layer and various modifications may be made. Also, as illustrated in FIG. 1, the planarization layer 140 includes or defines an opening outside the display area DA to allow a portion of the planarization layer 140 in the display area DA to be physically separated from a portion of the planarization layer 140 in the second area 2A. The opening in the planarization layer 140 is for reducing or effectively preventing external impurities, etc. from reaching the inside of the display area DA through the inside of the planarization layer 140.

Inside the display area DA, the OLED 300 including the pixel electrode 310, an opposite electrode 330 and an intermediate layer 320 therebetween may be arranged on the planarization layer 140. The intermediate layer 320 includes an emission layer with which light is generated and emitted from the OLED 300. As illustrated in FIG. 1, the pixel electrode 310 is electrically connected to the TFT 210 by the pixel electrode 310 contacting one of the source electrode 215a and the drain electrode 215b through an opening formed in the planarization layer 140.

A pixel-defining layer 150 may be arranged on the planarization layer 140. The pixel-defining layer 150 defines a pixel of the display device at a portion of the substrate 100, by including an opening corresponding to each sub-pixel, that is, an opening exposing at least a central portion of the pixel electrode 310. Also, in the case illustrated in FIG. 1, the pixel-defining layer 150 reduces or effectively prevents electrical arc, etc. from occurring at an edge of the pixel electrode 310 by increasing a distance between an edge of the pixel electrode 310 and the opposite electrode 330 which is overlapping the pixel electrode 310. The pixel-defining layer 150 may include, for example, an organic material such as polyimide or HMDSO. Components of the display device such as the OLED 300, the TFT 210, the pixel, the sub-pixel etc. may be provided in plurality on the substrate 100.

The intermediate layer 320 of the OLED 300 may include a relatively low molecular or polymer material. In the case where the intermediate layer 320 includes a relatively low molecular material, the intermediate layer 320 may have a structure in which a hole injection layer ("HIL"), a hole transport layer ("HTL"), an emission layer ("EML"), an electron transport layer ("ETL"), an electron injection layer ("EIL"), etc. are stacked in a single or a composite configuration. The intermediate layer 320 may include various organic materials such as copper phthalocyanine (CuPc), N,N'-Di(naphthalene-1-yl)-N,N'-diphenyl-benzidine ("NPB"), and tris-8-hydroxyquinoline aluminum (Alq3). These layers may be formed by vacuum evaporation.

In the case where the intermediate layer 320 includes a polymer material, the intermediate layer 320 may generally have a structure including an HTL and an EML. In this case, the HTL may include poly(3,4-ethylenedioxythiophene) ("PEDOT"), and the EML may include a polymer material such as polyphenylene vinylene ("PPV")-based material and a polyfluorene-based material. The intermediate layer 320 may be formed by screen printing, ink-jet printing, laser induced thermal imaging ("LITI"), etc.

The structure of the intermediate layer 320 is not limited to the above-described structure and may have various structures. In an exemplary embodiment, for example, the intermediate layer 320 may include a layer having one body over a plurality of pixel electrodes 310 or may include a layer patterned to respectively correspond to the plurality of pixel electrodes 310.

The opposite electrode 330 is arranged over the display area DA. As illustrated in FIG. 1, the opposite electrode 330 may be arranged to cover the display area DA. That is, the opposite electrode 330 may be formed as one body over a plurality of OLEDs 300 to correspond to the plurality of pixel electrodes 310.

Since the OLED 300 may be easily damaged by external moisture or oxygen, an encapsulation layer 400 may cover and protect the OLED 300. The encapsulation layer 400 may cover the display area DA and extend to outside of the display area DA. As illustrated in FIG. 1, the encapsulation layer 400 may include a first inorganic encapsulation layer 410, an organic encapsulation layer 420 and a second inorganic encapsulation layer 430.

The first inorganic encapsulation layer 410 may cover the opposite electrode 330 and include a silicon oxide, a silicon nitride and/or a silicon oxynitride. When needed, other layers such as a capping layer may be between the first inorganic encapsulation layer 410 and the opposite electrode 330. Since the first inorganic encapsulation layer 410 follows a profile of a structure thereunder, an upper surface of the first inorganic encapsulation layer 410 is not planarized as illustrated in FIG. 1.

The organic encapsulation layer 420 covers the first inorganic encapsulation layer 410. Unlike the first inorganic encapsulation layer 410, an upper surface of the organic encapsulation layer 420 may be made approximately flat such as to planarize the first inorganic encapsulation layer 410. Specifically, an upper surface of a portion of the organic encapsulation layer 420 corresponding to the display area DA may be made approximately flat. The organic encapsulation layer 420 may include at least one of PET, PEN, PC, PI, polyethylene sulfonate, polyoxymethylene ("POM"), PAR and HMDSO.

The second inorganic encapsulation layer 430 may cover the organic encapsulation layer 420 and include a silicon oxide, a silicon nitride and/or a silicon oxynitride. The second inorganic encapsulation layer 430 may prevent exposure of the organic encapsulation layer 420 to outside elements by contacting the first inorganic encapsulation layer 410 at an edge outside the display area DA.

Since the encapsulation layer 400 includes the first inorganic encapsulation layer 410, the organic encapsulation layer 420 and the second encapsulation layer 430, even though a crack occurs inside the encapsulation layer 400, the encapsulation layer 400 may reduce or effectively prevent the crack from being connected between the first inorganic encapsulation layer 410 and the organic encapsulation layer 420, or between the organic encapsulation layer 420 and the second inorganic encapsulation layer 430 through the above-described multi-layered structure. Through this, forming of a path through which external moisture or oxygen penetrates into the display area DA may be effectively prevented or minimized.

When needed, a process of forming a touch electrode (not shown) of various patterns for a touchscreen function, or a touch protective layer (not shown) for protecting the touch electrode on the encapsulation layer 400 may be further performed.

Also, as illustrated in FIG. 1, a polarization plate 520 may be attached on the encapsulation layer 400 such as by using an optically clear adhesive ("OCA") 510 when needed. In this case, the OCA 510 may fill the opening physically separating the portion of the planarization layer 140 corresponding to the display area DA from the portion of the planarization layer 140 corresponding to the second area 2A. The polarization plate 520 may not be attached during this operation and may be attached after other elements are formed, and various modifications may be made.

The polarization plate 520 may reduce reflection of external light. In an embodiment, for example, when the external light that has passed through the polarization plate 520 from outside of the display device is reflected by an upper surface of the opposite electrode 330 and then passes through the polarization plate 520 again, the external light passes through the polarization plate 520 twice and the phase of the external light may be changed. Therefore, the phase of reflected light may be different from the phase of the external light entering the polarization plate 520 and thus destructive interference occurs. Accordingly, the reflection of the external light may be reduced and visibility may be improved. The OCA 510 and the polarization plate 520 may be arranged to cover an opening of the planarization layer 140 as shown in FIG. 1. The OCA 150, the polarization plate 520 and the planarization layer 140 is exposed at the non-display area of the display device.

An operation of forming the polarization plate 520 is not always performed when the display device according to the present embodiment is manufactured. When needed, the polarization plate 520 may be replaced with another element. In an exemplary embodiment, for example, an operation of forming a black matrix and a color filter on may be performed instead of attaching the polarization plate 520 to reduce the reflection of external light in a completed display device afterward.

A protective film 170 is attached on a second surface, which is a rear surface (−z direction) of the substrate 100. The protective film 170 may include PET. The protective film 170 may be attached on the second surface of the substrate 100 by using an adhesive layer 180. The adhesive layer 180 may include a pressure sensitive adhesive ("PSA"). In this case, the protective film 170 is attached to correspond to the first area 1A, at least a portion of the second area 2A, and the bent area BA of the substrate 100.

Attaching the protective film 170 on the second surface of the substrate 100 may be performed after display element, etc. are formed on the first surface of the substrate 100. Since an operation of deposition, etc. may be performed during a process of forming the display element, etc., when such a process is performed after the protective film 170 is attached on the second surface of the substrate 100, the protective film 170 may be damaged during that process. However, in the case where the protective film 170 has sufficient durability, the display element, etc. may be formed on the first surface of the substrate 100 after the protective film 170 is attached on the second surface of the substrate 100.

Figure 2:
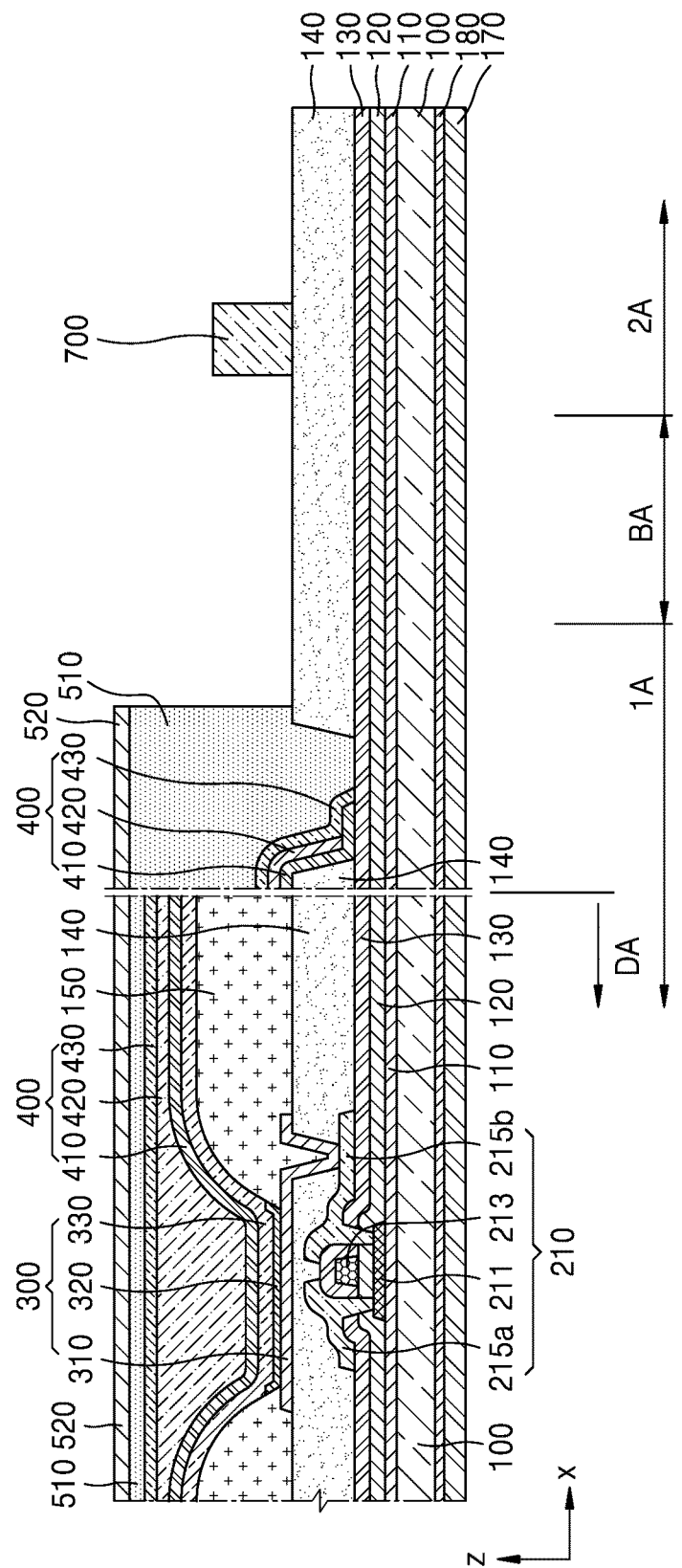

After the protective film 170 is attached on the second surface of the substrate 100, an electronic element 700 is attached on the first surface of the substrate 100 corresponding to the second area 2A as illustrated in FIG. 2. Here, the electronic element 700 may include an integrated circuit such as a driving element. A control or driving signal may be provided from the electronic element 700 to the display area, via various conductive connections therebetween.

Though FIG. 2 illustrates the electronic element 700 is arranged on the planarization layer 140 for convenience of illustration, various modifications may be made. In an exemplary embodiment, for example, an opening is formed in the planarization layer 140, and at least a portion of a pad or a wiring electrically connected to the display area and disposed under the planarization layer 140, or a conductive layer, etc. electrically connected to the pad or the wiring connected to the display area and disposed under the planarization layer 140 may be exposed. The pad or a wiring electrically connected to the display area may be connected to the display area at the display element disposed therein.

With the opening in the planarization layer 140 exposing an underlying conductive element or wiring, a bump, etc. of the electronic element 700 may be electrically connected to a relevant conductive signal line or wiring by an anisotropic conductive film. Thus, the electronic element 700 disposed in the second area 2A may be connected to the display area at the first area 1A of the substrate 100, via the respective pad, wiring, bump, conductive signal line, etc.

Alternatively, when the pixel electrode 310 of the OLED 300 is formed, a conductive layer simultaneously formed from a same material layer as that of the pixel electrode 310 may be formed on the planarization layer 140 on which the electronic element 700 will be arranged. The conductive layer above the planarization layer 140 may be electrically connected to a pad or a wiring below the planarization layer 140, and the electronic element 700 may be electrically connected to the conductive layer. Therefore, consequently, the electronic element 700 may be electrically connected to the pad or the wiring underlying the planarization layer 140.

While the electronic element 700 is attached to the substrate 100 and the layers thereon, the substrate 100, etc. may be heated. In an exemplary embodiment, for example, while the electronic element 700 is attached to the substrate 100 and the layers thereon, the substrate 100 may be heated at least locally at temperature of about 210° Celsius for about 7 seconds. In a conventional method of manufacturing a display device, during this heating process, damage such as occurrence of wrinkle in the substrate 100 having a flexible or bendable characteristic may occur.

However, in one or more embodiment of a method of manufacturing the display device according to the invention, since the protective film 170 is attached on the second surface of the substrate 100 opposite to that surface on which the electronic element 700 is attached, the protective film 170 supports the substrate 100 and thus may effectively prevent the substrate 100 from being damaged or deformed during a process of attaching the electronic element 700.

Figure 3:
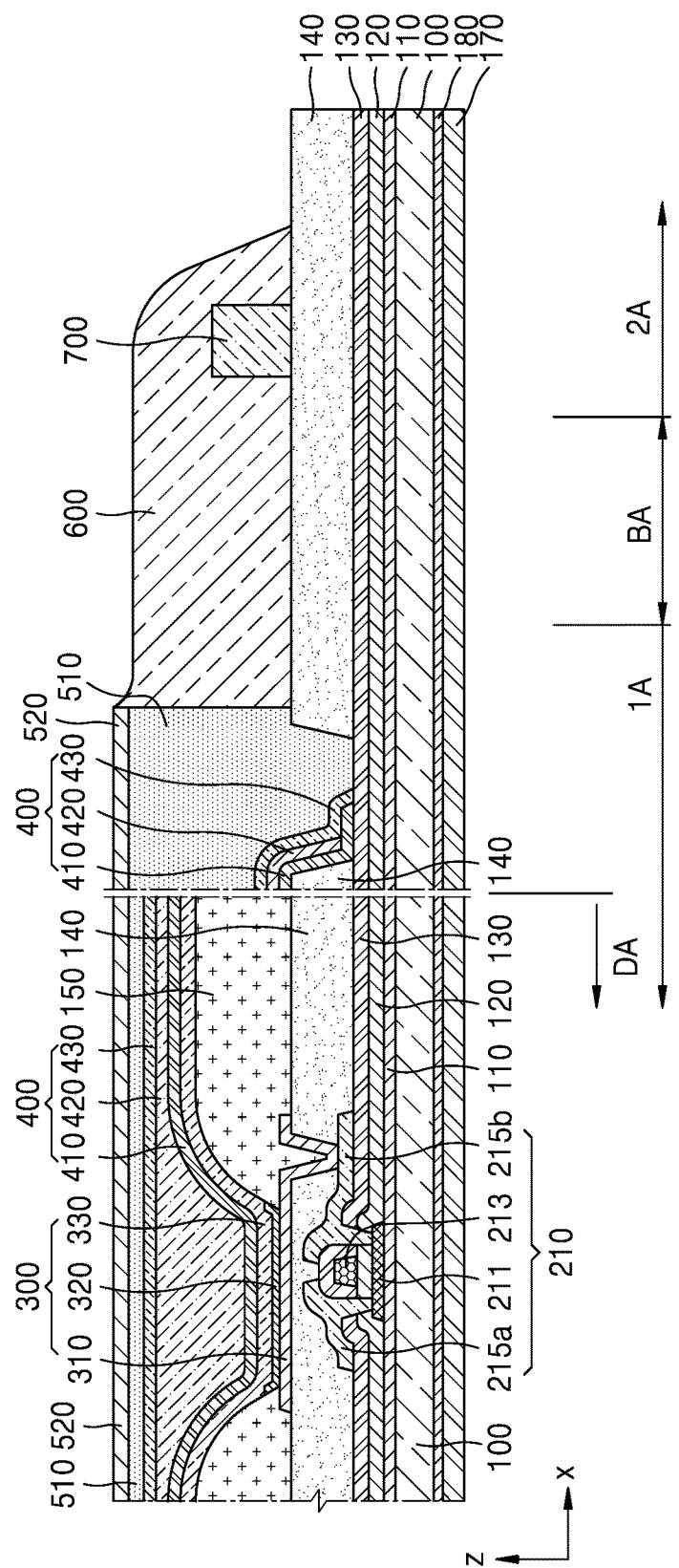

As illustrated in FIG. 3, a bending protective layer 600 is formed to cover the electronic element 700 on a portion of the first surface of the substrate 100 corresponding to at least the bent area BA as illustrated in FIG. 3.

When a stacked body including a plurality of layers is bent, a stress-neutral plane exists within the stacked body at which there is neither tensile stress nor compressive stress (e.g., stress-neutral plane). If the bending protective layer 600 is absent at the portion of the substrate 100 which is bent (e.g., the bent area BA), excessive tensile stress, etc. may be applied to a wiring (not shown) arranged as a layer on the substrate 100 within the bent area BA while the substrate 100, etc. are bent afterwards as described below. This excessive tensile stress is generated because a location of the wiring within the bent area BA may not correspond to a stress-neutral plane. However, a location of a stress-neutral plane may be adjusted in a stacked body such as including all of the substrate 100, the wiring, the bending protective layer 600, etc. in the bent area BA by providing the bending protective layer 600 and adjusting a thickness and a modulus of the bending protective layer 600. Therefore, tensile stress applied to the wiring in the bent area BA may be minimized by allowing a stress-neutral plane to be arranged in the vicinity of the wiring in the bent area BA through applying the bending protective layer 600 at the bent area BA.

Particularly, since the bending protective layer 600 is formed to cover the electronic element 700, the bending protective layer 600 also protects the electronic element 700. In a conventional method of manufacturing a display device, if the bending protective layer 600 does not cover the electronic element 700, a cover for protecting the electronic element 700 may be separately attached afterwards. However, in one or more embodiment of the method of manufacturing the display device according to the invention may protect the electronic element 700 effectively without performing a process of separately attaching a cover for protecting the electronic element 700.

Also, since the bending protective layer 600 covers the electronic element 700, the bending protective layer 600 covers a portion of the second area 2A of the substrate 100 adjacent to the bent area BA. Therefore, while the substrate 100 is bent in the bent area BA, damage to the substrate 100 or the wirings, etc. on the substrate 100 due to stress generated from a portion of the second area 2A adjacent to the bent area BA may be effectively prevented.

Although FIG. 3 illustrates that an upper surface of the bending protective layer 600 in a direction (−x direction) of the display area DA coincides (e.g., is aligned) with an upper surface (+z direction) of the polarization plate 520, the embodiment is not limited thereto. In an exemplary embodiment, for example, an end of the bending protective layer 600 in the direction (−x direction) of the display area DA may cover a portion of an edge upper surface of the polarization plate 520. Alternatively, an end of the bending protective layer 600 in the direction (−x direction) of the display area DA may not contact the polarization plate 520 and/or the OCA 510.

Figure 4:
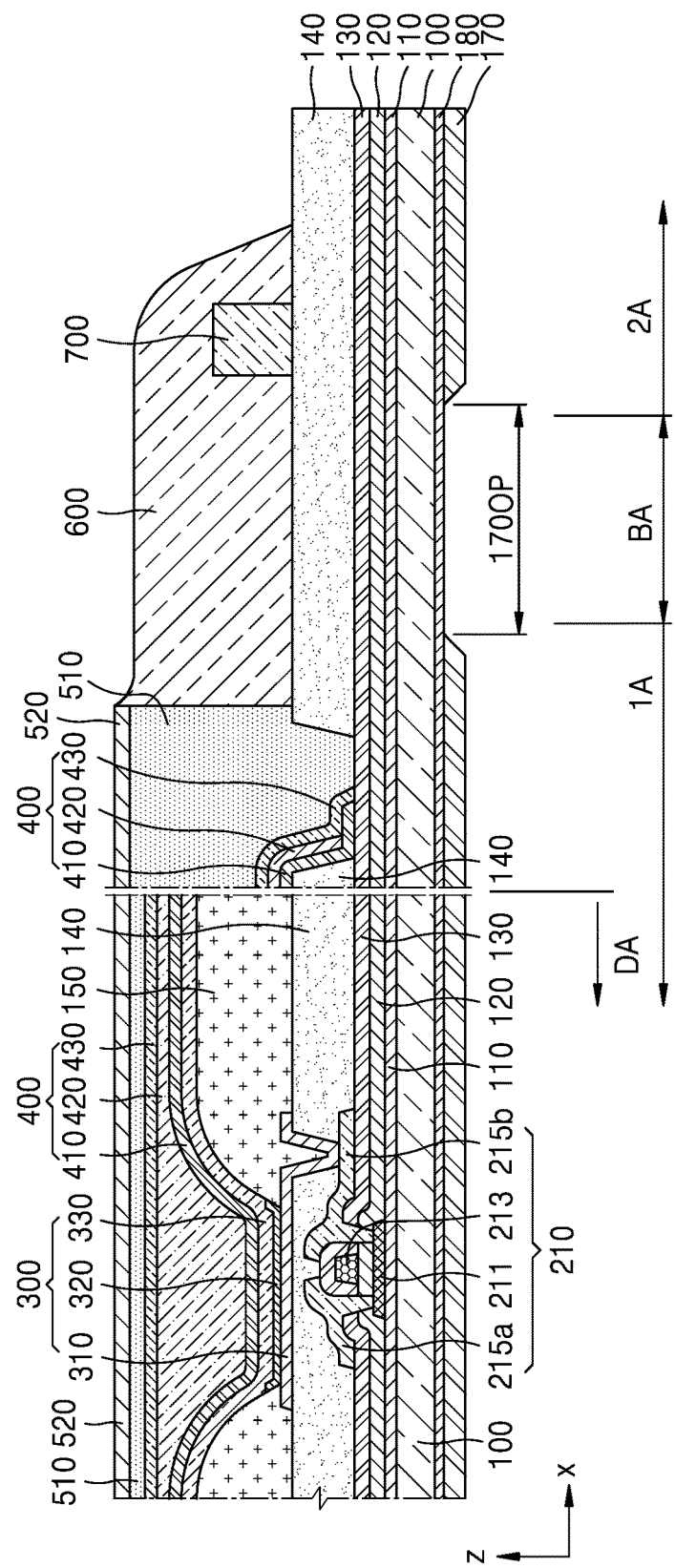

As illustrated in FIG. 4, an opening 170OP is formed into the protective film 170 by removing at least a portion of the protective film 170 corresponding to at least the bent area BA. The opening 170OP may have a shape extending in a first direction (+y direction), as well as the second direction (+x direction). Since the substrate 100 having the above-described layers formed thereon is bent in the bent area BA with such layers thereon as described above, when the protective film 170 exists in the bent area BA, bending the substrate 100, etc. is not easy due to strength of the protective film 170 supporting and protecting the substrate 100. Therefore, before the substrate 100, etc. are bent, the opening 170OP is formed in the protective film 170 by removing at least a portion of a portion of the protective film 170 corresponding to at least the bent area BA as illustrated in FIG. 4.

The opening 170OP may be formed in the protective film 170 by various methods. In an exemplary embodiment, a portion of the protective film 170 is removed by bringing a heated heat block into contact with the portion of the protective film 170 which will be removed. In another exemplary embodiment, the opening 170OP may be formed by irradiating a laser beam, etc. to the protective film 170. However, in this case, the already formed protective layer 600 or electronic element 170, etc. may be damaged by the laser beam. Therefore, a portion of the protective film 170 by bringing a heated heat block into contact with the portion of the protective film 170 which will be removed.

The heat block may include, for example, a stainless steel ("SUS") material, and may be heated to temperature of about 520° Celsius and then brought into contact with the protective film 170. The substrate 100 is not heated directly and the heat block is heated separately and then brought into contact with the protective film 170. Since the heat block is brought into contact with the protective film 170 instantaneously, for example, for about 1 to 2 seconds, other elements such as the substrate 100 are not damaged by heat of the heat block during a process of forming the opening 170OP.

Also, since the opening 170OP is formed by using the heat block as described above, the resulting protective film 170 may include a heat-degenerated portion adjacent to the opening 170OP and degenerated by heat. The heat-degenerated portion adjacent to the opening 170OP may have higher strength than a strength of remaining portions of the protective film 170 and have a shape different from a shape of the remaining portions of the protective film 170. Also, as illustrated in FIG. 4, even when the opening 170OP is formed in the protective film 170, the adhesive layer 180 between the protective film 170 and the substrate 100 may remain inside and exposed by the opening 170OP.

In a conventional method of manufacturing a display device, the opening 170OP may be formed in the protective film 170 before attaching the electronic element 700 to the substrate 100 having the above-described layers thereon. However, in this case, the substrate 100 having the opening 170OP in the protective film 170 may be damaged during a process of attaching the electronic element 700. As described above, while the electronic element 700 is attached, the substrate 100, etc. may be heated. If the electronic element 700 is attached with the opening 170OP formed in the protective film 170, a problem, etc. that wrinkle occurs in the bent area BA of the substrate 100 during a process of attaching the electronic element 700 may occur. However, in one or more embodiment, since the method of manufacturing the display device according to the invention forms the opening 170OP in the protective film 170 after the electronic element 700 is attached, the protective film 170 effectively supports the bent area BA, etc. of the substrate 100 during a process of attaching the electronic element 700 and thus effectively prevents damage from occurring in the substrate 100.

In a conventional method of manufacturing a display device, even when the electronic element 700 is attached with the opening 170OP formed in the protective film 170, if the electronic element 700 is attached with the bending protective layer 600 formed in the bent area BA, the bending protective layer 600 may protect the bent area BA, etc. of the substrate 100. Therefore, damage may be effectively prevented from occurring in the substrate 100 during a process of attaching the electronic element 700.

However, in this case, since the bending protective layer 600 is formed before the electronic element 700 is attached, the bending protective layer 600 cannot cover the electronic element 700. Therefore, a separate cover for protecting the electronic element 700 is attached to cover the electronic element 700. However, a process may become complicated and the number of required parts may increase. Also, since the bending protective layer 600 does not extend to a position at which the electronic element 700 will be attached, the bending protective layer 600 cannot sufficiently cover a portion of the second area 2A of the substrate 100 adjacent to the bent area BA. This may cause a problem that the substrate 100 or the wirings, etc. on the substrate 100 may be damaged due to stress generated from a portion of the second area 2A adjacent to the bent area BA while the substrate 100 is bent in the bent area BA afterwards or after that.

One or more embodiment of the method of manufacturing the display device according to the invention performs a process of attaching the electronic element 700, allowing the bending protective layer 600 to cover the electronic element 700, and forming the opening 170OP in the protective film 170, in order. Therefore, since one or more embodiment of the method of manufacturing the display device according to the invention does not need to adopt a separate additional element for protecting the electronic element 700 while at the same time reducing or effectively preventing the substrate 100 from being damaged during a process of attaching the electronic element 700, manufacturing costs may be reduced and a defect occurrence rate during a manufacturing process may be reduced. Also, while the substrate 100 is bent in the bent area BA after forming the above-described layers on the substrate 100, damage to the substrate 100 or the wirings, etc. on the substrate 100 due to stress generated from a portion of the second area 2A adjacent to the bent area BA may be reduced or effectively prevented.

Figure 5:
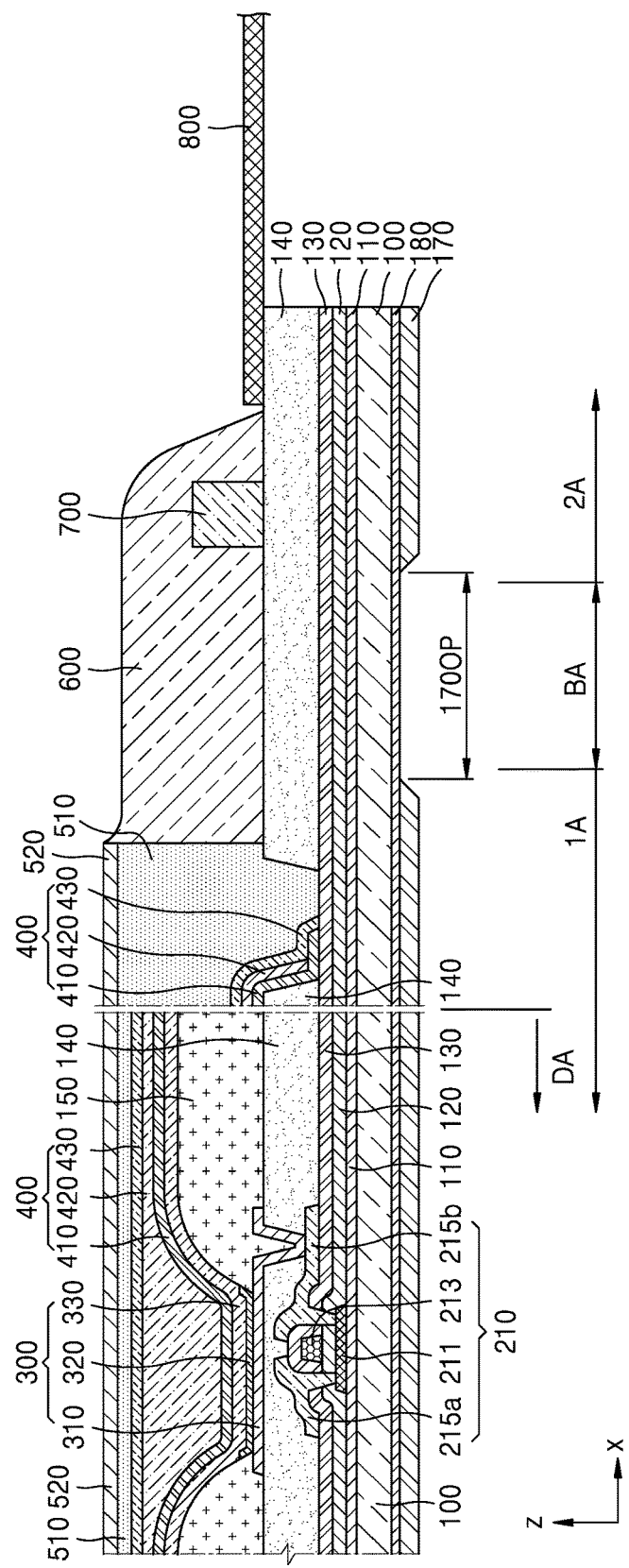

After the opening 170OP is formed in the protective film 170 as described above, a printed circuit board ("PCB") 800 may be attached on a portion of the first surface of the second area 2A of the substrate 100 not covered by the bending protective layer 600 as illustrated in FIG. 5. The PCB 800 may be electrically connected to the electronic element 700 or a conductive element, etc. inside the display area DA by a pad or a wiring (not shown). A control and or driving signal may be provided from the PCB 800, through the pad or wiring, to the electronic element 700 and/or the pixels of the display area DA so as to operate the pixels to display an image at the display area DA.

Referring to FIG. 5, the substrate 100 and the various layers thereon, may be disposable in a flat arrangement, such as generally in a single plane defined by two directions (e.g., the x direction and the y direction). From the flat arrangement of FIG. 5, the substrate 100 and the various layers thereon may be deformed at the bent area BA to dispose components in the bent area BA and second area 2A in a different plane than the display area DA.

Figure 6:
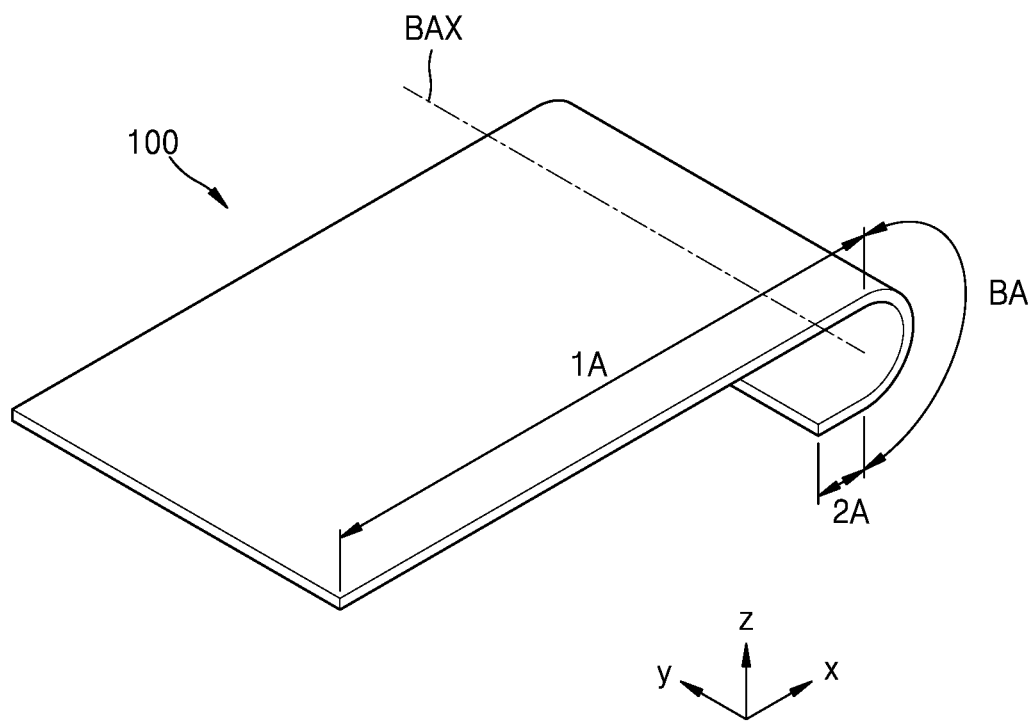
FIG. 6 is a perspective view of a portion of an exemplary embodiment of a display device manufactured through the processes of FIGS. 1 to 5.

FIG. 6 is a perspective view of a portion of an exemplary embodiment of a display device manufactured through the processes of FIGS. 1 to 5. The structure of FIGS. 1 to 5 is generally labeled as "100" in FIG. 6 for convenience of illustration.

Referring to FIG. 6 a portion of the first area 1A may be allowed to face at least a portion of the second area 2A by bending the substrate 100, etc. in the bent area BA around the bending axis BAX extending in the first direction (+y direction). Thus, the first surface of the bent area BA is arranged facing outside the display device and the second surface of the bent area BA is arranged facing inside the display device as illustrated in FIG. 6.

Unlike FIGS. 1 to 5, layers including an inorganic material among various layers described above on the substrate 100 may have an opening corresponding to the bent area BA similar to that discussed for the protective film 170. In an exemplary embodiment, for example, the buffer layer 110, the gate insulating layer 120 and/or the interlayer insulating layer 130 may have or define an opening corresponding to the bent area BA. Similar to that described for the protective film 170, the opening in the buffer layer 110, the gate insulating layer 120 and/or the interlayer insulating layer 130 as inorganic layers may reduce or effectively prevent a crack, etc. from occurring due to stress applied to the inorganic layers when the substrate 100, etc. are bent.

Different from that described for layers including an inorganic material among various layers described above on the substrate 100, a layer including an organic material may exist even in the bent area BA. In an exemplary embodiment, for example, the organic material may fill an opening in the layer including the inorganic material when needed. Also, a wiring, etc. including metal material electrically connecting elements in the first area 1A to the second area 2A may be arranged on the organic material layer or inside the organic material layer in the bent area BA. The conductive wiring arranged on or in the organic material layer in the bent area BA may effectively prevent or minimize damage of the wiring by allowing stress generated during the bending process of the substrate 100 and layers thereon to be alleviated by the organic material. The same is true of embodiments described below and modifications thereof.

Figure 7:
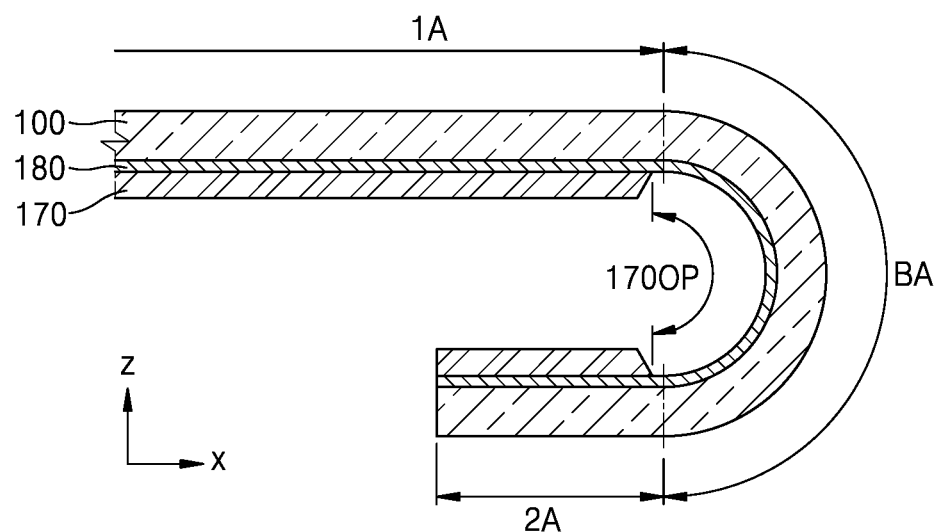
FIG. 7 is a cross-sectional view of a portion of an exemplary embodiment of a display device manufactured through the processes of FIGS. 1 to 5.

FIG. 7 is a cross-sectional view of a portion, specifically, the substrate 100, the protective film 170 and the adhesive layer 180 of an exemplary embodiment of a display device manufactured through the processes of FIGS. 1 to 5. Various above-described layers disposed on the substrate 100 except for the protective film 170 and the adhesive layer 180 are omitted for convenience of illustration. Following a profile of the substrate 100 and layers thereon in the flat arrangement in FIG. 5, a dimension of the opening 170OP along the x direction is larger than a total length of the bent area BA of the substrate 100 and layers thereon along the x direction.

From the flat arrangement illustrated in FIG. 5, as illustrated in FIG. 7, the substrate 100 may be bent in the bent area BA. Since the protective film 170 protects the rear surface of the substrate 100, the protective film 170 may have strength owing to the material or characteristics thereof. Accordingly, in the case where the protective film 170 has relatively low flexibility, when the substrate 100 is bent, exfoliation between the protective film 170 and the substrate 100 may occur. However, in one or more embodiment of the display device according to the invention, since the protective film 170 includes the opening 170OP corresponding to the bent area BA, the protective film 170 having the relatively low flexibility may effectively prevent such exfoliation from occurring.

To minimize stress applied to the protective film 170, the bent area BA may be arranged inside the opening 170OP of the protective film 170 as illustrated in FIG. 7. As being "inside," an area of the opening 170OP of the protective film 170 being wider than an area of the substrate 100 at the bent area BA thereof. More particularly, following a profile of the substrate 100 and layers thereon in FIG. 7, a dimension of the opening 170OP along the x direction is larger than a total length of the bent area BA of the substrate 100 and layers thereon along the x direction. A minimum length of the opening 170OP may be equal to or larger than a maximum dimension of the bent area BA. However, the present disclosure is not limited thereto.

Figure 8:
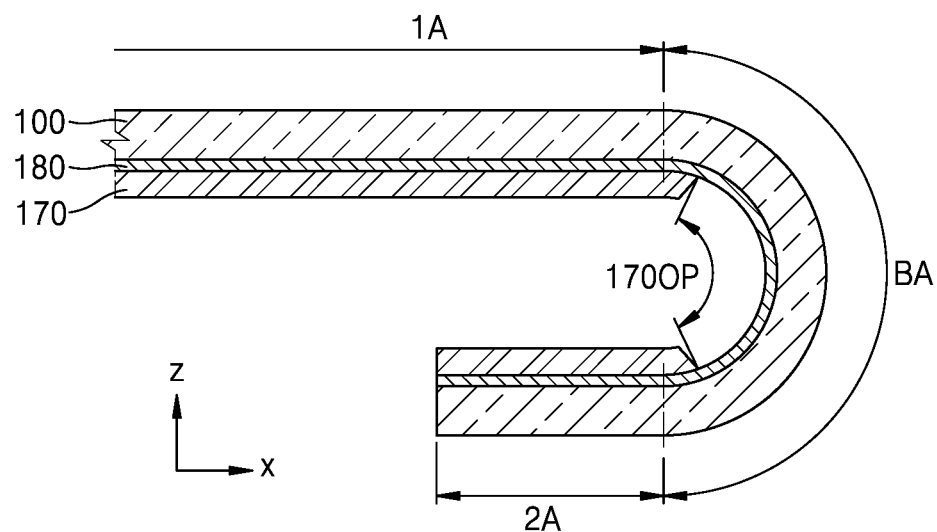
FIG. 8 is a cross-sectional view of a portion of another exemplary embodiment of a display device manufactured by a method of manufacturing a display device, according to the invention.

FIG. 8 is a cross-sectional view of a portion of another exemplary embodiment of a display device manufactured by a method of manufacturing a display device, according to the invention. Various above-described layers disposed on the substrate 100 except for the protective film 170 and the adhesive layer 180 are omitted for convenience of illustration. In an alternative exemplary embodiment, following a profile of the substrate 100 and layers thereon in the flat arrangement in FIG. 5, a dimension of the opening 170OP along the x direction may be smaller than a total length of the bent area BA of the substrate 100 and layers thereon along the x direction. From the flat arrangement in which a dimension of the opening 170OP along the x direction is smaller than a total length of the bent area BA, the substrate 100 may be bent in the bent area BA.

For the bent substrate 100 having a dimension of the opening 170OP smaller than a total length of the bent area BA, as illustrated in FIG. 8, which is a cross-sectional view of a portion of an exemplary embodiment of a display device according to the invention, the opening 170OP of the protective film 170 may be arranged inside the bent area BA. As being "inside," an area of the bent area BA is wider than an area of the opening 170OP of the protective film 170. More particularly, following a profile of the substrate 100 and layers thereon in FIG. 8, a total length of the bent area BA of the substrate 100 and layers thereon along the x direction is larger than a dimension of the opening 170OP along the x direction. A minimum length of the bent area BA may be equal to or larger than a maximum dimension of the opening 170OP. Even in the case illustrated in FIG. 8, since the bending protective layer 600 (not shown in FIG. 8, see FIG. 5) exists in the bent area BA, and the bending protective layer 600 covers a portion of the first area 1A adjacent to the bent area BA and a portion of the second area 2A adjacent to the bent area BA, stress applied to portions of the substrate 100 and layers thereon, corresponding to both of opposing ends (edges) of the opening 170OP of the protective film 170 along the x direction, may be effectively distributed.

When the opening 170OP is formed in the protective film 170 such as by using the heat block as illustrated in FIG. 4, a portion of a portion of the protective film 170 which will be removed sublimates or evaporates but another portion may not sublimate or evaporate and may move from an original position thereof to be disposed in another position. In this case, as illustrated in FIG. 9, which is a cross-sectional view of a portion of another exemplary embodiment of a display device manufactured by a method of manufacturing a display device according to the invention, the remaining portion, which has not sublimated or evaporated, may move from an original position thereof to the vicinity of the opening 170OP.

Figure 9:
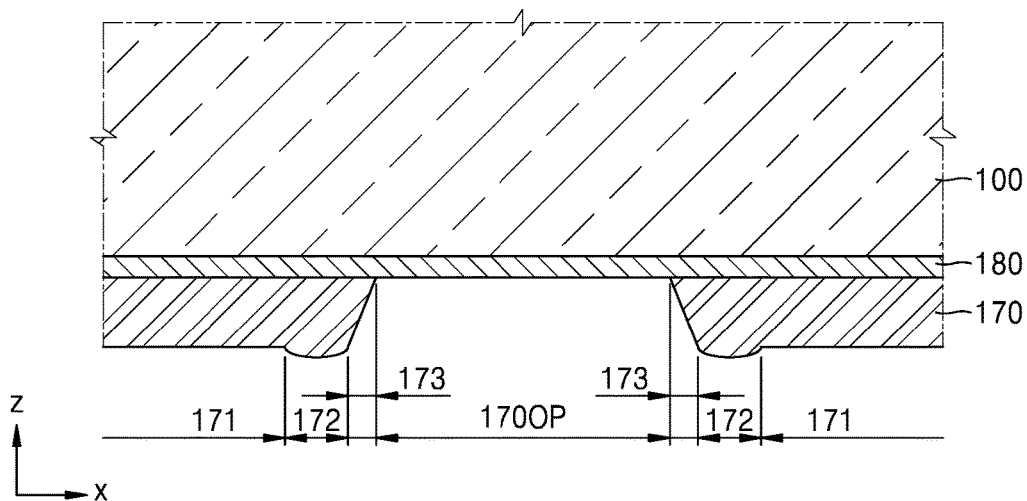
FIG. 9 is a cross-sectional view of a portion of still another exemplary embodiment of a display device manufactured by a method of manufacturing a display device, according to the invention.

Accordingly, as illustrated in FIG. 9, the protective film 170 includes a first portion 171 having a constant thickness and a second portion 172 having a thickness greater than the thickness of the first portion 171. Particularly, depending on cases, a function of the protective film 170 as a protective layer in the vicinity of the opening 170OP may be effectively prevented from deteriorating due to the forming of the opening 170OP by intentionally allowing the thicker second portion 172 to remain in the vicinity of the opening 170OP of the protective film 170. The second portion 172 may be understood as, for example, the above-described heat-degenerated portion. Also, in this case, as illustrated in FIG. 9, a third portion 173 having a decreasing thickness from the second portion 172 toward the opening 170OP may exist between the second portion 172 and the opening 170OP. The opening 170OP is a groove in the protective film 170 which extends completely through a thickness of the protective film 170, such that an underlying layer such as the adhesive layer 180 is exposed at the opening 170OP.

Figure 10:
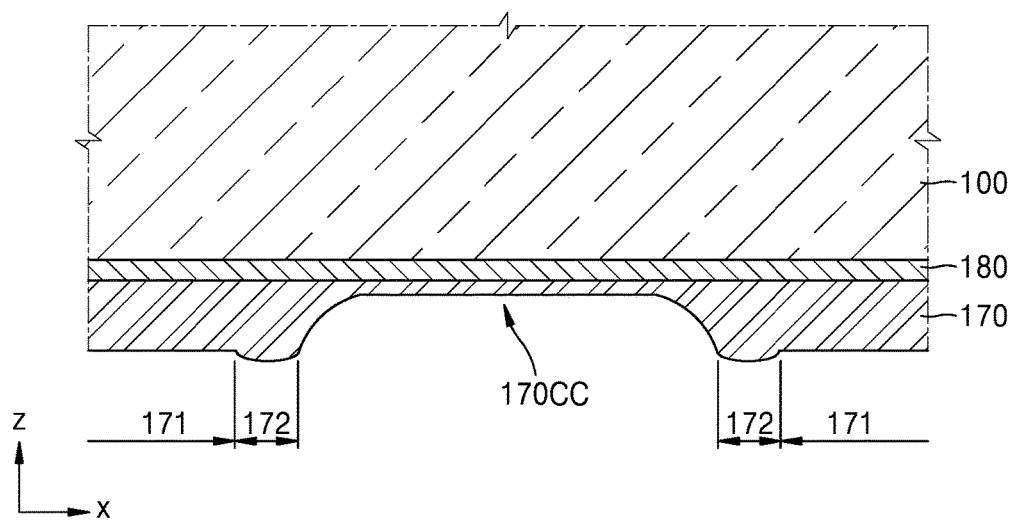
FIG. 10 is a cross-sectional view of a portion of a modified exemplary embodiment of a display device manufactured by a method of manufacturing a display device, according to the invention.

Up to now, though the case of forming the opening 170OP through a thickness of the protective film 170 has been described, the present disclosure is not limited thereto. In an exemplary embodiment, for example, as illustrated in FIG. 10, which is a cross-sectional view of a portion of modified exemplary embodiment of a display device according to the invention, the protective film 170 may include a groove 170CC corresponding to the bent area BA. This may be implemented by removing a portion of the protective film 170 corresponding to the bent area BA incompletely, that is, not completely through a thickness of the protective film 170. A thickness of the protective film 170 in the groove 170CC may be reduced toward a center of the groove 170CC from the second portion 172. The thickness of the protective film 170 may be constant in the vicinity of the center of the groove 170CC.

Since the protective film 170 protects the rear surface of the substrate 100, the protective film 170 may have strength owing to the material or characteristics thereof. Accordingly, in the case where the protective film 170 has relatively low flexibility, when the substrate 100 is bent, exfoliation between the protective film 170 and the substrate 100 may occur. However, in one or more embodiment of the display device according to the invention, since the protective film 170 includes a reduced thickness area thereof at the groove 170CC corresponding to the bent area BA, the protective film 170 having the relatively low flexibility may effectively prevent such exfoliation from occurring. As illustrated in FIG. 10, the protective film 170 having the groove 170CC defined therein may include a first portion 171 having a constant thickness, and a second portion 172 adjacent to the groove 170CC and having a thickness greater than the thickness of the first portion 171. The second portion 172 may be understood as, for example, a heat-degenerated portion described above.

Various descriptions of the above embodiments and modifications thereof are immediately applicable to a case where the protective film 170 includes the groove 170CC instead of the opening 170OP.

Although exemplary embodiments of a method of manufacturing a display device has been described, the present disclosure is not limited thereto. A display device having modified structures from those in the above-described embodiments and manufactured through the method also falls within the scope of the present disclosure.

In an exemplary embodiment, for example, a display device may have an initial structure illustrated in FIG. 5. Though FIG. 5 illustrates that the substrate 100, etc. is not bent (e.g., in a flat state thereof), one or more embodiment of the invention includes the display device in FIG. 5 as a bent display device including the substrate 100 in which the first surface in the bent area is arranged facing outside the display device and the second surface at the bent area is arranged facing inside the display device, the bent area BA being arranged between the first area 1A and the second area 2A along a profile of the display device.

The display device according to the present embodiment includes a display unit including a display element arranged on the first surface of the substrate 100 such that the display element is arranged in at least the first area 1A, the electronic element 700 arranged on the first surface of the substrate 100 such that the electronic element 700 is arranged in the second area 2A, and the bending protective layer 600 arranged on the first surface of the substrate 100, corresponding to at least the bent area BA, and covering the electronic element 700. Also, the display device includes the protective film 170 arranged on the second surface of the substrate 100 and including the opening 170OP corresponding to the bent area BA. In the display device according to the present embodiment, since the bending protective layer 600 covers the electronic element 700, the bending protective layer 600 may protect the electronic element 700 and an additional case or covering for the electronic element 700 is not required. Also, a defect may be prevented from occurring in the wiring or the substrate 100 due to stress in the vicinity of the bent area BA by allowing the bending protective layer 600 to cover a portion of the first area 1A adjacent to the bent area BA.

The protective film 170 may include a heat-degenerated portion adjacent to the opening 170OP at which a material forming the protective film 170 is degenerated by heat during forming of the opening 170OP. Also, as illustrated in FIG. 9, the protective film 170 may include a first portion 171 having a constant thickness, and a second portion 172 adjacent to the opening 170OP and having a thickness greater than the thickness of the first portion 171. The second portion 172 may be understood as a heat-degenerated portion degenerated by heat. Also, the PCB 800 may be attached to a portion of the second area 2A which is not covered by (e.g., exposed by) the bending protective layer 600.

The present disclosure is not limited thereto, and a display device in which the protective film 170 includes the groove 170CC instead of the opening 170OP falls within the scope of the present disclosure. Also, contents described in detail in the above embodiments and modifications thereof in relation to the manufacturing method are applicable to a display device according to the present embodiment and/or modifications thereof.

Although the disclosure has been described with reference to the embodiments illustrated in the drawings, this is merely provided as an example and it will be understood by those of ordinary skill in the art that various changes in form and details and equivalents thereof may be made therein without departing from the spirit and scope of the disclosure as defined by the following claims.

What is claimed is:

1. A display device comprising:
   a substrate comprising:
      a first surface,
      a second surface opposite to the first surface,
      a first area,
      a second area at an end portion of the substrate, and
      a bent area between the first and second areas, the first surface in the bent area arranged facing outside the display device and the second surface in the bent area arranged inside the display device;
   a display element on the first surface in the first area of the substrate;
   an electronic element on the first surface in the second area of the substrate;
   a bending protective layer on the first surface in the bent area of the substrate, the bending protective layer extending from the bent area of the substrate to cover the electronic element in the second area of the substrate; and
   a protective film on the second surface of the substrate, wherein a groove is defined in the protective film in the bent area of the substrate.

2. The display device of claim 1, wherein the protective film in the bent area of the substrate comprises a heat-degenerated portion adjacent to the groove.

3. The display device of claim 1, wherein the protective film in the bent area of the substrate comprises:
   a first portion having a constant thickness, and
   a second portion adjacent to the groove, the second portion between the first portion and the groove and having a thickness greater than that of the first portion.

4. The display device of claim 1, wherein the bending protective layer extended from the bent area of the substrate to cover the electronic element in the second area of the substrate exposes a portion of the second area of the substrate,
   further comprising a printed circuit board attached to the exposed portion of the second area.

5. The display device of claim 1, wherein the bending protective layer further extends from the bent area of the substrate to be disposed in the first area of the substrate.

6. The display device of claim 1, wherein
   the bent area of the substrate is between the first and second areas thereof in a first direction along the substrate, and
   in the first direction along the substrate, a length of the bent area thereof is smaller than a length of the groove.

7. The display device of claim 1, wherein
   the bent area of the substrate is between the first and second areas thereof in a first direction along the substrate, and
   in the first direction along the substrate, a length of the bent area thereof is larger than a length of the groove.

8. The display device of claim 1, wherein in the groove defined in the protective film in the bent area of the substrate, the second surface of the substrate is exposed by the groove.

9. The display device of claim 1, wherein in the groove defined in the protective film in the bent area of the substrate, a portion of the protective remains on the second surface of the substrate.

* * * * *